US006223320B1

United States Patent
Dubey et al.

(10) Patent No.: US 6,223,320 B1
(45) Date of Patent: Apr. 24, 2001

(54) EFFICIENT CRC GENERATION UTILIZING PARALLEL TABLE LOOKUP OPERATIONS

(75) Inventors: Pradeep Kumar Dubey, White Plains; Marc Adam Kaplan, Katonah, both of NY (US); Sanjay Mukund Joshi, Baltimore, MD (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/021,516

(22) Filed: Feb. 10, 1998

(51) Int. Cl.[7] ............................ H03M 13/00; G06F 11/10
(52) U.S. Cl. ......................... 714/757; 714/781; 714/807
(58) Field of Search ......................... 714/781, 758, 714/759, 807, 782, 800, 801, 808, 757

(56) References Cited

U.S. PATENT DOCUMENTS

| | | | |
|---|---|---|---|
| 5,537,421 | * 7/1996 | Dujari et al. ......................... | 714/752 |
| 5,619,516 | * 4/1997 | Li et al. .............................. | 714/807 |
| 5,778,013 | * 7/1998 | Jedwab .............................. | 714/807 |
| 5,959,786 | * 9/1999 | Bellenger .......................... | 370/401 |
| 6,029,186 | * 2/2000 | DesJardines et al. ............... | 708/492 |

OTHER PUBLICATIONS

Abbott et al. Broadband Algorithms with the MicroUnity Mediaprocessor, IEEE, p. 349–354, 1996.*

Griffiths et al., The Tea–Leaf Reader Algorithm: An efficient Implementation of CRC–16 and CRC–32, ACM, p. 617–620, Jul. 1987.*

Ramabadran et al., A Tutorial on CRC Computations, IEEE, p. 62–75, 1988.*

Albertengo et al., Parallel CRC Generation, IEEE, p. 63–71, Oct. 1990.*

Sarwate, Computation of Cyclic Redundancy Checks via Table Look–Up, ACM p. 1008–1013, Aug. 1988.*

"A Painless Guide to CRC Error Detection/Algorithms", R.N. Williams, Aug. 19, 1993, ftp://ftp.rocksoft.com/clients/rocksoft/papers/crc_v3.txt.

"The Great CRC Mystery", T. Ritter, 1986, Dr. Dobb's Journal of Software Tools, Feb. 11(2):26–34, 76–83, http://www.io.com/~ritter/ARTS/CRCMYST.HTM.

* cited by examiner

*Primary Examiner*—Albert DeCady
*Assistant Examiner*—Shelly A Chase

(57) ABSTRACT

An improved CRC generation mechanism for generating a CRC value of relevant data in a digital data stream is disclosed wherein relevant data in the data stream is identified and partitioned into a plurality of intervals. A CRC value is determined for each interval by partitioning the interval into a plurality of chunks, loading from persistent storage a table of CRC values for a range of chunks, determining a CRC value for each of the chunks with parallel table lookup operations on the table, and combining the CRC values for the chunks. The CRC values for each of the intervals is combined to generate the CRC for the relevant data. The parallel table look operation is preferably a vector permute instruction that is executed by a SIMD-style vector unit.

34 Claims, 8 Drawing Sheets

| i:  | 0  | 1  | 2  | 3  | 4  | 5  | 6  | 7  | 8  | 9  | A  | B  | C  | D  | E  | F  |
|-----|----|----|----|----|----|----|----|----|----|----|----|----|----|----|----|----|
| VB: | 0a | 0f | 02 | 0e | 03 | 08 | 09 | 04 | 04 | 09 | 08 | 03 | 01 | 02 | 05 | 0b |
| VA: | 31 | 59 | 26 | DE | AD | 27 | 18 | 28 | 18 | BE | EF | 16 | 18 | 03 | 40 |
| VT: | BE | 40 | 59 | 03 | 26 | 28 | 18 | DE | DE | 18 | 28 | 26 | 41 | 59 | AD | EF |

Fig. 4

Loop with J:= 4 bit values of ranging from 0 through F(hex) (101)

$V_J$ = J||00000000000000000000000000000000(hex), a 128 bit string (103)

$C_J$ = CRC($V_J$), compute (32-bit (4 byte)) CRC using conventional method (105)

End loop, goto 103 with next value of J or goto 109 (107)

Rearrange and store the 16 4-byte $C_J$ (rowwise) values as 4 (columnwise) 16 byte vectors T0,T1,T2,T3 - as depicted in Figure 6. (109)

Fig. 5

|     | T0 | T1 | T2 | T3 |
|-----|----|----|----|----|
| C [0] | 00 | 00 | 00 | 00 |
| C [1] | f2 | f9 | c8 | ce |
| C [2] | e1 | 32 | 8c | 2b |
| C [3] | 13 | cb | 44 | e5 |
| C [4] | c6 | a4 | 05 | e1 |
| C [5] | 34 | 5d | cd | 2f |
| C [6] | 27 | 96 | 89 | ca |
| C [7] | d5 | 6f | 41 | 04 |
| C [8] | 89 | 89 | 16 | 75 |
| C [9] | 7b | 70 | de | bb |
| C [A] | 68 | bb | 9a | 5e |
| C [B] | 9a | 42 | 52 | 90 |
| C [C] | 4f | 2d | 13 | 94 |
| C [D] | bd | d4 | db | 5a |
| C [E] | ae | 1f | 9f | bf |
| C [F] | 5c | e6 | 57 | 71 |

T0 = 00f2e113c63427d5897b689a4fbdae5c
T1 = 00f932cba45d966f8970bb422dd41fe6
T2 = 00c88c4405cd894116de9a5213db9f57
T3 = 00ce2be5e12fca0475bb5e90945abf71

Fig. 6

| Identify relevant data in data stream | —(201)

| Partition all of the relevant data into 128 bit intervals, D[0], D[1],...,D[k-1] but with one final interval F, which is 156 or more bits. | —(203)

| RRx:= 0000....0000 (156 0-valued bits) | —(205)

| Loop with i:= 0 to k-1 by 1 | —(207)

| RRx:= (RRx) xor (D[i]), leftmost 128 bits | —(209)

| RRx:= Update-partial-CRC-result(RRx), as depicted in Figure 8. | —(211)

| End loop, goto 209 with next value of i or goto 215 | —(213)

| F:=(F) xor (RRx), leftmost 156 bits | —(215)

| CRC32:= CRC(F), compute 32-bit CRC on F using conventional method | —(217)

| Return CRC32 | —(219)

Fig. 7

Load registers T0,T1,T2,T3 with values computed in step 109, depicted in Figures E and F. (301)

V := (RRx), leftmost 128 bits (303)

RRx := (RRx<<128), leftshift by 128 bits, right-filling with 0-valued bits (305)

V0 := (V>>4) & (0F0F0F0F0F0F0F0F0F0F0F0F0F0F0F0F(hex))
V1 := V & (0F0F0F0F0F0F0F0F0F0F0F0F0F0F0F0F(hex)) (307)

permute R00,T0,V0; permute R01,T1,V0; permute R02,T2,V0; permute R03,T3,V0
permute R10,T0,V1; permute R11,T1,V1; permute R12,T2,V1; permute R13,T3,V1 (309)

RRv := (R00) xor (R01>>8) xor (R02>>16) xor (R03>>24)
xor (R10>>4) xor (R11>>12) xor (R12>>20) xor (R13>>28),
extending all $R_{xy}$ operands to 156 bits by right padding with 0-valued bits (311)

RRx := (RRx) xor (RRv) (313)

Fig. 8

| Preamble | SFD | DA | SA | Length | LLC Data | Pad | FCS |

SFD = Start Frame Delimiter
DA  = Destination Address
SA  = Source Address
FCS = Frame Check Sequence

Fig. 9

EFFICIENT CRC GENERATION UTILIZING PARALLEL TABLE LOOKUP OPERATIONS

BACKGROUND OF THE INVENTION

1. Technical Field

This invention relates to the field of error detection in digital communication systems and, in particular, to methods for generating and checking a cyclic redundancy check (CRC) in a message transferred over a digital communication system.

2. Related Art

Cyclic redundancy check (CRC) is an important error detection tool used in communication systems and data processing systems. CRC is a kind of checksum that is transmitted with data.

In a communication system wherein data is communicated between a source node and a target node over a communication link, the source node calculates the CRC of data to be transferred over the link using a predetermined polynomial. The source node then transmits the data along with the CRC over the link target node. The target node receives the data, independently generates the CRC of the received data using the predetermined generating polynomial, and compares the independently generated CRC with the CRC received from the source node. If the two CRC values match, no error is assumed to have occurred during the transmission. If the two CRC values do not match, an error is assumed to have occurred during the transmission. In this case, the target node may utilize error correction techniques to correct errors that have occurred during transmission and/or request re-transmission of the data by the source node.

In a data processing systems wherein data is transferred via an I/O bus from a storage device to memory for access by devices of the data processing system, the storage device calculates the CRC of data to be transferred over the I/O bus using a predetermined polynomial. The storage device then transmits the data along with the CRC over the I/O bus to memory. A processing unit independently generates the CRC of the received data using the predetermined generating polynomial, and compares the independently generated CRC with the CRC received from the storage device. If the two CRC values match, no error is assumed to have occurred during the transmission. If the two CRC values do not match, an error is assumed to have occurred during the transmission. In this case, the processing unit may utilize error correction techniques to correct errors that have occurred during transmission and/or request re-transmission of the data by the storage device.

A more detailed description of the use of CRC for error detection may be found in Ritter, T., February 1986, "Great CRC Mystery. Dr. Dobb's Journal of Software Tools", 11(2), pgs 26–34, 76–83, herein incorporated by reference in its entirety.

The basic CRC generation algorithm for a W-bit CRC can be written as the following pseudo-code:

1. CRC=0 (Initialization)
2. Augment message by W zeros
3. pop=top bit of CRC
4. shift CRC left by 1 bit, read in 1 bit from the message
5. If pop=1, CRC=XOR (CRC, polynomial)
6. If more message bits, goto step 3.

This algorithm is very time consuming since it operates on 1 bit at time.

This simple algorithm can be speeded up by grouping the operations on a number of bits. The most convenient grouping is 8 bits (or 1 byte) as shown in R. N. Williams, "A Painless Guide to CRC Error Detection Algorithms", Version 3, Aug. 19, 1993, ftp://ftp.rocksoft.corn/clients/rocksoft/papers/crc-v3.txt, herein incorporated by reference in its entirety. In this example, step 3 is modified to pop the top byte of the CRC and step 4 is modified to shift the CRC by 8 bits and read in 8 bits of the message. In addition step 5 is modified as follows: the top byte of the CRC identified in step 3 and the 8 bits of the message identified in step 4 are combined using an XOR operation, and the result is used an index into a table. The table contains the 256 entries storing the 256 precomputed CRCs for the range of 8 bit values (00-FF). The resultant CRC read from the table is then combined with the CRC shifted by 8 bits in step 4 using an XOR operation to form the new updated CRC value, and the operation continues to step 5.

Note that such table driven algorithms require a large table (i.e., 256 W-bit entries) and utilize a single table look-up per iteration.

SUMMARY OF THE INVENTION

The above-stated problems and related problems of the prior art are solved with the principles of the present invention, efficient CRC generation utilizing parallel table lookup operations wherein relevant data in the data stream is identified and partitioned into a plurality of intervals. A CRC value is determined for each interval by partitioning the interval into a plurality of chunks, loading from persistent storage a table of CRC values for a range of chunks, determining a CRC value for each of the chunks with parallel table lookup operations on the table, and combining the CRC values for the chunks. The CRC values for each of the intervals is combined to generate the CRC for the relevant data. The parallel table look operation is preferably a vector permute instruction that is executed by a SIMD-style vector unit.

BRIEF DESCRIPTION OF THE DRAWINGS

FIG. 4 is an example of a permute instruction.

FIG. 5 is a flow chart illustrating operations in pre-computing the CRC values for a range of fixed data strings.

FIG. 6 is a pictorial illustration of a mapping of the pre-computed CRC values to vector registers.

FIG. 7 is a flow chart illustrating operations in computing the CRC value of data in a data stream according to the present invention.

FIG. 8 is a flow chart illustrating operations that utilize the permute instruction to compute the CRC value of data in the data stream according to the present invention.

FIG. 9 is a pictorial illustration of the format of IEEE 802.4 data frame.

DETAILED DESCRIPTION OF THE PREFERRED EMBODIMENTS

Figure 1:
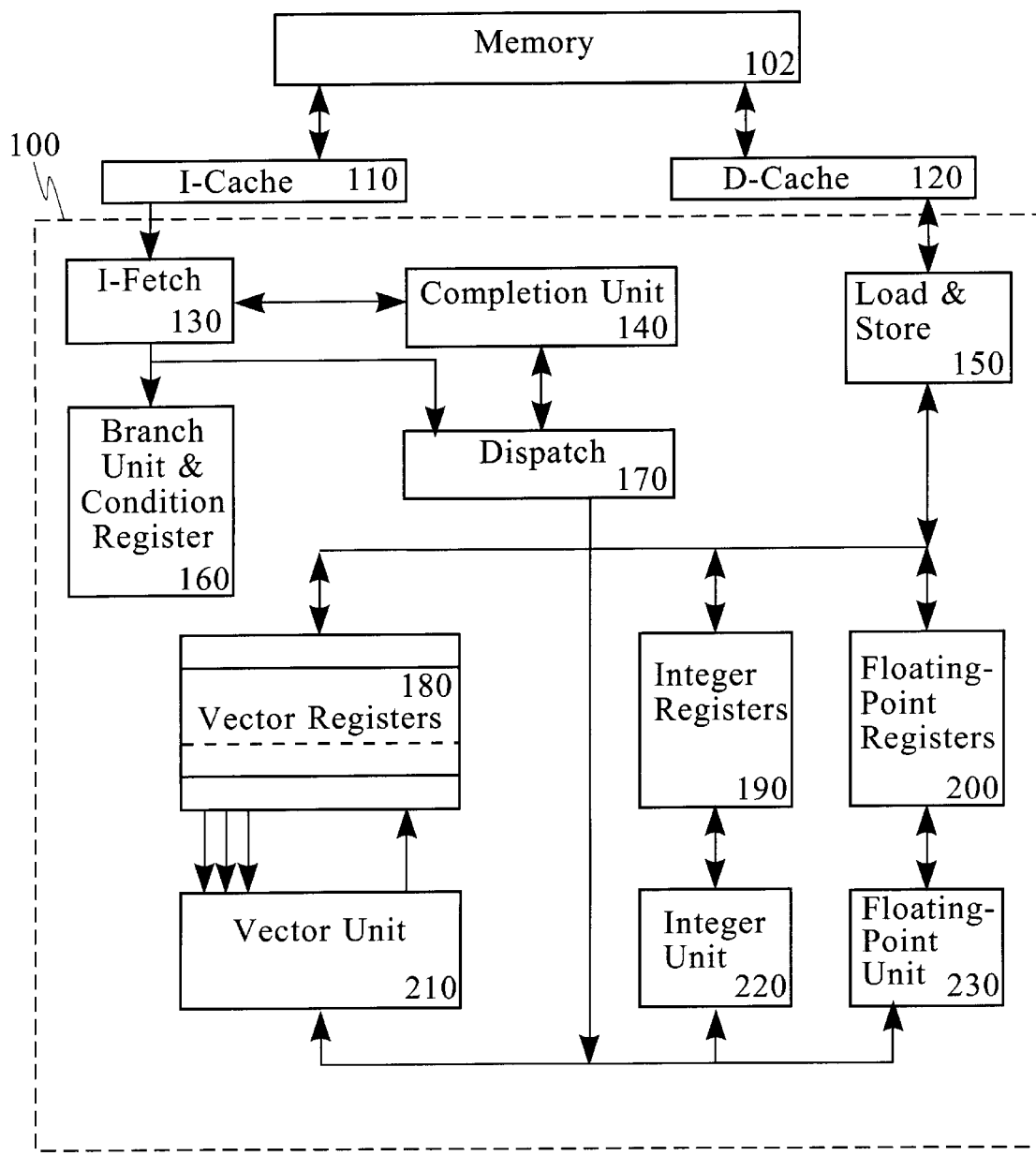
FIG. 1 is a functional block diagram of a processing system in which the present invention is embodied.

FIG. 1 is a functional block diagram illustrating a processing system wherein the present invention is embodied.

The processing system includes a processor unit 100 and an associated memory unit 102. The memory unit 102 holds program data and instructions to be executed on the processor unit 100. As is conventional, the memory unit 102 is interfaced with an instruction cache unit 110 and a data cache unit 120 such that frequently used instruction and data portions of the memory unit 102 are kept in an instruction cache unit 110 and data cache unit 120, respectively. Alternatively, the instruction and data cache units 110, 120 may be merged into a single unified cache. Access time for the cache units 110, 120 are typically much smaller than that of the memory unit 102. The instruction cache and/or data cache units 110,120 may also be comprised of multiple caches or multilevel caches as is also well known.

Typically, the instructions/data stored in the instruction cache 110 and data cache 120, respectively, are divided into lines (typically referred to as blocks). An instruction fetch unit 130 fetches one or more blocks of instructions stored in the instruction cache 110, forwards branch instructions and condition register update instructions to a branch unit 160 for execution, and forwards sequential (non-branch instructions) to a dispatch unit 170. The dispatch unit 170 analyses dependencies among pending instructions, and schedules execution of instructions on one or more functional units. The functional units may be symmetric, where each functional unit is capable of executing all types of sequential instructions. In the alterative, the functional units may be asymmetric, where a specific unit is capable of executing only certain subset of sequential instructions. The functional units receive input source operands from and write the output results to one or more register files and/or the data cache unit 120. The register file(s) provides operands to the functional units for executing instructions and also receives results of execution. The set(s) is further broken down into architecturally visible set of registers and architecturally invisible registers. Architecturally visible, or architected registers, refer to the fixed set of registers that are accessible to the assembly level programmer (or the compiler) of the machine. The functional units may execute instructions out-of-sequential-order. In such a system, the register file(s) typically utilizes register rename buffers and register renaming techniques to store the operands used by the functional units in executing the instructions and the results produced by the functional units. Such a register file is well known in prior art.

A load/store unit 150 handles fetching and writing of blocks of data from/to the data cache 120 to the functional units as needed. The data cache unit 120 holds data values used as source operands by the instructions and some of the data values generated by executed instructions. Since multiple memory-resident data values may be simultaneously required by the functional units and multiple memory-bound results may be simultaneously generated, the data cache unit 120 is typically multi-ported.

The processor unit 100 also includes a completion unit 140 responsible for completing instruction execution in an order considered a valid order by the architecture. Even though the functional units may execute instructions out-of-order, the processor unit 100 may or may not be allowed to complete the instructions in the same order, depending on the architectural constraints.

The branch unit 160 predicts unresolved branches, and determines the validity of each prediction on branch resolution. The branch unit 160 also includes a condition register, which is used for evaluating the outcome of conditional branches, and logic that updates the condition register according to the results of operations performed by the functional units.

In the preferred embodiment, the functional units may be asymmetric, where a specific unit is capable of executing only certain subset of sequential instructions. In this case, the register file is typically partitioned logically into subsets corresponding to the functionality of the functional units. Note that the logical partitioning of the register file may be architecturally visible or invisible. Moreover, the register files may be logically separate yet physically share common circuitry. In addition, the dispatch unit 170 must be aware of this asymmetry and schedule the instructions appropriately.

An exemplary asymmetric system is shown in FIG. 1. The functional units include one or more fixed point units 220 (one shown) for performing fixed-point operations, one or more floating-point units 230 (one shown) for performing floating-point operations), and one or more vector units 210 (one shown) for performing vector operations on one or more source vectors. The fixed-point operations performed by the fixed point units 220 may include fixed-point addition, fixed-point subtraction, fixed-point multiplication, fixed-point division, AND, OR, XOR, fixed-point compare, fixed-point rotate, and fixed-point shift operations. The floating-point operations performed by the floating-point units 230 may include floating-point addition, floating-point substraction, floating-point multiplication, floating-point division and floating point compare operations The vector operations performed by the vector units 210 characteristically have an inherent high degree of parallelism. Preferably, such vector operations are SIMD-style operations wherein an instruction performs the same operation on a multiple data elements within the source vectors. The fixed-point unit(s) 220 receive input source operands from and write the output results to a fixed-point register file 190 and/or the data cache unit 120. The floating point unit(s) 230 receive input source operands from and write the output results to a floating point register file 200 and/or the data cache unit 120. The vector unit 210 receives input vectors from and write the output results to a vector register file 180 and/or the data cache unit 120. Note the fixed-point register file 190, the floating-point register file 200 and the vector register file 1 80 may be architecturally visible or invisible and, in addition, may be logically separate yet physically share common circuitry.

In an alternate embodiment, all the functional units may be identical and hence capable of executing any of the operations described herein with respect to the fixed-point unit 220, floating-point unit 230 and vector unit 210.

Figure 2:
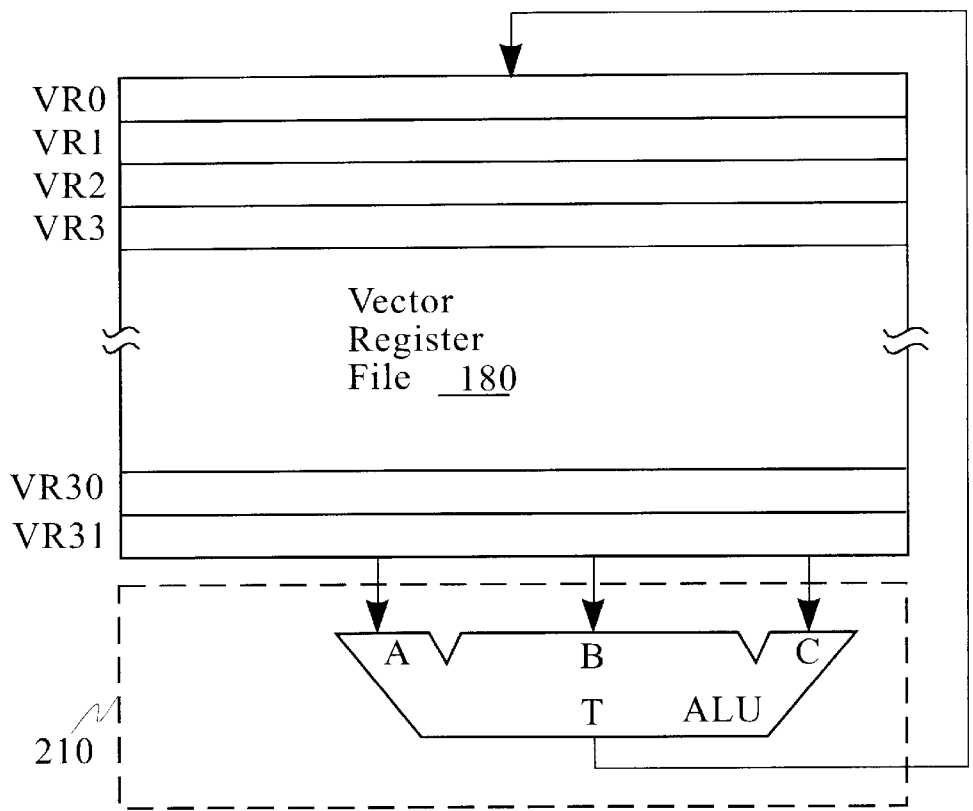
FIG. 2 is a pictorial representation of the vector unit of the processing system of FIG. 1.
Figure 3:
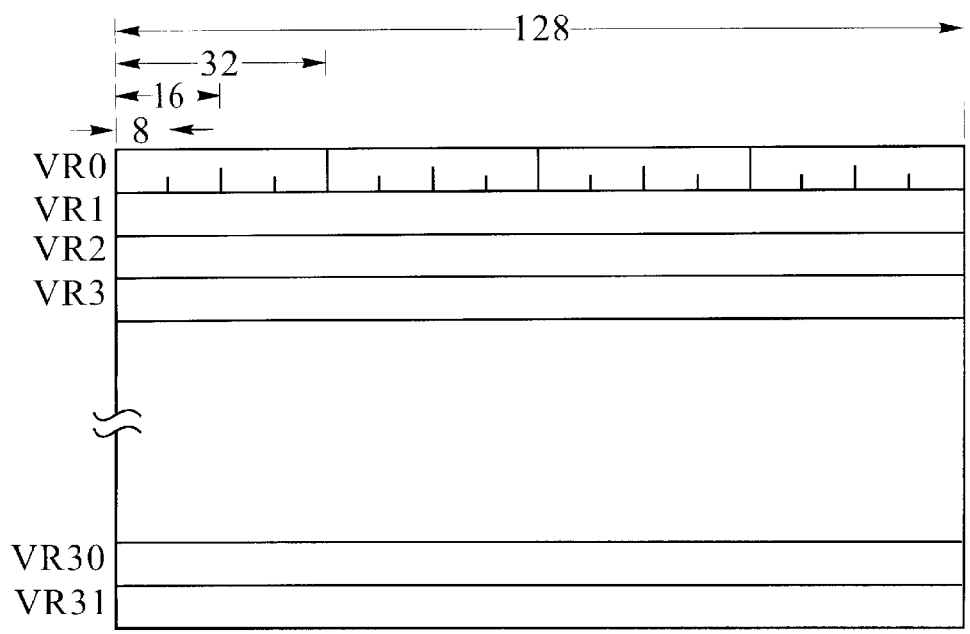
FIG. 3 is pictorial illustration of the vector register file of the vector unit of FIG. 2.

An exemplary implementation of the vector unit 210 and vector register file 180 is shown in FIG. 2. In this implementation, the vector register file 180 includes a set of 32 registers VR0,VR1 . . . VR31 each 128 bits in length. As shown in FIG. 3, each 128-bit register can store 16 8-bit integers, 8 16-bit integers, 4 32-bit integers, or 4 32-bit (single precision) floating point numbers. The vector unit 210 comprises one or more arithmetic logic units (one shown) capable of operating on source vectors read from the vector register file 180 (or other storage means for storing the source vectors) and producing a single result for each architected instruction. For example, the ALU shown in FIG. 2 operates on 3 source vectors supplied to the ALU via ports A,B,C and outputs the result of the architected instruction via port T for storage in the vector register file 180. Preferably, the ALUs are SIMD-style ALUs wherein an instruction performs the same operation on multiple data elements within the source vectors. In addition, the ALU(s) may be logically partitioned based upon the format of data within the source vector(s) for the various vector operations of the architected instructions of the vector unit 210. For example, the ALU(s) shown in FIG. 2 may be logically partitioned into i) 16 ALUs for operating on vectors storing 16 8-bit integers, ii) 8 ALUs for operating on vectors storing 8 16-bit integers, and iii) 4 ALUs for operating on vectors storing 4 32-bit integers and vectors storing 4 32-bit (single precision) floating-point numbers.

The ALUs of the vector unit 210 may be symmetric, wherein each ALU is capable of executing all of the architected instructions of the vector unit 210. In the alternative, the ALUs may be may be asymmetric, where a specific ALU is capable of executing only certain subset of the architected instructions of the vector unit 210. In addition, the ALUs may be pipelined.

The present invention requires that the instruction set architecture of the vector unit 210 include an instruction (denoted a "permute" instruction) that performs the following operations in parallel: selects data elements from at least one source vector register VA based upon indices stored as data elements in at least one source vector register VB, and writes the selected data elements into a target vector register VT. An example of such a permute instruction is represented below:

```
permute VT, VA, VB
    do I = 0 to 127 in steps of 8
        b <--- (VB)_{I+4:I+7} * 8
        (VT)_{I:I+7} <--- (VA)_{b:b+7}
    end
```

This instruction performs the following operations in parallel:

$b_0 \leftarrow$ --(VB)$_{4:7}$ * 8(VT)$_{0:7}$ $\leftarrow$ --(VA)$_{b0:b0+7}$
$b_1 \leftarrow$ --(VB)$_{12:15}$ * 8(VT)$_{8:15}$ $\leftarrow$ --(VA)$_{b1:b1+7}$
$b_2 \leftarrow$ --(VB)$_{20:23}$ * 8(VT)$_{16:23}$ $\leftarrow$ --(VA))$_{b2:b2+7}$
$b_3 \leftarrow$ --(VB)$_{28:31}$ * 8(VT)$_{24:31}$ $\leftarrow$ --(VA)$_{b3:b3+7}$
. . .
$b_{15} \leftarrow$ --(VB)$_{124:127}$ * 8(VT)$_{120:127}$ $\leftarrow$ --(VA)$_{b15:b15+7}$ In this example, an index $b_0$ is represented by bits 4 through 7 of VB is multiplied by 8 to compute a bit position in VA, and the 8-bits starting from the indica $b_0$ in vector VA are copied to bits 0–7 of the target vector VT. A graphical example of such a permute instruction is shown in FIG. 4 where

| | |
|---|---|
| (Byte indices) | 0 1 2 3 4 5 6 7 8 9 A B C D E F |
| VA (in hex) of | 31415926DEAD27182818BEEF16180340 |
| VB (in hex) of | 0A0F020E030809040409080301020050B |
| yielding vector: | |
| VT (in hex) of | BE405903262818DEDE1828264159ADEF |

Note that the permute instruction implements an operation that is more general than the strictly mathematical usage of the word "permute" connotes, in that the result is not necessarily a permutation of the bytes of vector VA.

An example of such a permute instruction is the gselect8 instruction of the MicroUnity mediaprocessor as outlined Abott et al., "Broadband Algorithms with the MicroUnity Mediaprocessor", COMPSCON96, February 1996, pg. 4, herein incorporated by reference in its entirety. Another example of such a permute instruction is the vperm instruction of the Vector/SIMD Multimedia Extension to the PowerPC Architecture as outlined in the Specification Revision 1.2.3, dated Jul. 18, 1997, herein incorporated by reference in its entirety.

The present invention also requires that the instruction set architecture of the vector unit 210 include conventional "arithmetic", "logical", and "bit shifting" instructions as described below.

According to the present invention, the CRC values of each member of a set of fixed data values are pre-computed and stored as a table in the vector register file 180 of processor 100. The permute instruction of the vector unit is used to index into the stored table in order parallelize the calculation of the CRC of any data in a data stream, thereby providing improved performance over prior art methods. The CRC generation mechanism of the present invention is preferably embodied as a sequence of instructions that is stored in persistent storage, and loaded into the memory unit 102 for execution by the processor unit 100. In the alternative, portions or all of the functionality of the CRC generation mechanism of the present invention may be embodied in hardware.

For illustrative purposes, the present invention is described below in calculating a 32-bit CRC. However, the present invention is not limited in this respect and can be utilized to calculate a CRC of any length. In addition, when calculating the CRC of a data stream, a predetermined generating polynomial is used. An example of a common 32-bit CRC is the CRC-32 (CCITT) polynomial based upon a standard of the CCITT). The present invention may use the CRC-32 (CCITT) generating polynomial or may use any other predetermined generated polynomial.

FIG. 5 illustrates the operations in calculating the 32-bit CRC values of each of the fixed data values which are then stored in the vector register file 180. The characteristics of the permute instruction are used to determine the size of the table. For example, if the permute instruction uses 4 bits of each byte of vector VB as its "indices" then 16 32-bit CRC values are precomputed and stored; if the permute instruction could use the full 8 bits of each byte of vector VB as its "indices" and if it allowed its VA argument to extend to 256 bytes, (and if we had ample "fast storage" within vector register file 180 for VA) then we would precompute and store 256 32-bit CRC values. For example, consider the vector register file 180 described above with respect to FIG. 2 that includes a set of 32 registers VR0,VR1 . . . VR31 each 128 bits in length. In this case, the 16 32-bit CRC values can be stored in 4 128-bit vector registers. For illustrative purposes, the present invention is described below in calculating 16 32-bit CRC values for 16 fixed data values and storing these CRC values as a table in the vector register file 180. However, the present invention is not limited in this respect and can be utilized to exploit permute instructions with larger indices and larger vector register files.

More specifically, the operation begins in step 101 by looping through the range of 4-bit data values (i.e., J=[0,1, 2, . . . F]). For each data value J in the loop, steps 103 and 105 are performed. In step 103, 124 0-valued bits are appended to the four bit value J to form a 128 bit fixed data value $V_J$. For example, for J=9, $V_J$=90000000000000000000000000000000 (hex). In step 105, the 32-bit CRC of $V_J$ is calculated. The CRC value of $V_J$ may be denoted $C_J$ as follows: $C_J$=CRC ($V_J$). Any CRC generating method may be used to calculate the CRC of $V_J$, including conventional CRC generating methods. In step 107, the loop 101 ends and operation continues to step 109 wherein the 16 32-bit CRC values $C_J$ generated in step 105 are arranged and stored in memory and/or persistent storage. Preferably, the 16 32-bit CRC values $C_J$ generated in step 105 are arranged and stored in persistent storage as variables that efficiently map to vector registers within the vector register file 180 such that the vector registers can be used as an argument VA of the permute instruction to look up a "partial" CRC of arbitrary input data. For example, the 16 32-bit CRC values $C_0, C_1 \ldots C_F$ can be rearranged into 4 128-bit vectors T0 . . . T3 as shown in FIG. 6 where each of the 16 rows represents the 4 bytes of a CRC value $C_J$ and each of the 4 columns represents 16 bytes to be stored in a 128 bit vector register $T_1$. In this example, consider the vector T1. Bits 0–7 of T1 are copied from bits 8–15 of $C_0$, bits 8–15 of T1 are copied from bits 8–15 of $C_1$, bits 16–23 of T1 are copied from bits 8–15 of $C_2$, . . . bits 120–127 of T1 are copied from bits 8–15 of $C_F$.

FIGS. 7 and 8 illustrate operations that use the permute instruction of the vector unit 210 to index into the table of precomputed CRC values stored in the vector register file in order to parallelize the calculation of the CRC of data in a data stream. The operation begins in step 201 to identify relevant data in a data stream. For example, consider an IEEE 802.3 frame whose format is outlined in FIG. 9. In this case, the relevant fields for the CRC is defined as the DA field, SA field, Length field, LLC data field and Pad field of the frame. In this example, the selected relevant data includes the DA field, SA field, Length field, LLC data field and Pad field of the frame.

In step 203, the relevant fields selected in step 201 are partitioned into a set of intervals of fixed length and a final interval. The fixed length of the intervals within the set preferably corresponds to the bit-length of a register in vector register file 180 that can be used as operand VB of the permute instruction. For example, if the vector register that is used as operand VB of the permute instruction is 128 bits in length, the length of the intervals within the set is preferably 128 bits. The length of the final interval is preferably greater than or equal to the length of the partial CRC result generated in step 313 below; thus, the length of the final interval need not correspond to the fixed length of the intervals within the set. For example, if the length of the partial CRC result generated in step 313 below is 156 bits, the length of the final interval is preferably greater than or equal to 156 bits. In addition, there may be instances where it is advantageous to utilize conventional techniques to generate the CRC for the relevant fields and bypass the CRC calculations for the intervals as described below. For example, if the fixed length of the intervals within the set generated in step 203 is 128 bits, it is advantageous to use conventional techniques to generate the CRC for the relevant fields if the relevant fields are less than 284 bits (128+156 bits) in length.

In step 205, a "partial CRC result", denoted RRx, is initialized to a string, for example, of 156 0-valued bits. RRx may be stored be stored in 2 registers of vector register file 180.

In step 207, a loop is performed over the set of intervals generated in step 203 from the most significant interval to the least significant interval within the set. For the sake of the description below, we adopt a convention that the most significant interval is oriented to the left of the least significant interval. Steps 209–211 are performed for each interval in the loop.

In step 209, the "partial CRC result" RRx is augmented with portions of the current interval. For example, RRx may be augmented by an XOR operation that combines its leftmost 128 bits with the current 128 bit data interval.

In step 211, the augmented "partial CRC result" generated in step 209 is updated by using the permute instruction of the vector unit 210 to index into the table of precomputed CRC values (T0, T1, T2, T3) stored in the vector register file in order to parallelize the calculation of the CRC of the current interval. This computation also uses "shift" and "XOR" instructions to combine sub-results. An example of such operations in calculating the "partial 156 bit CRC result" on an interval 128 bits in length is set forth below with respect to FIG. 8.

Finally, in step 213, the loop ends and operation continues to step 215.

In step 215, the final interval is augmented by an XOR operation that combines the leftmost 156 bits of the final interval value with the 156 bit "partial CRC result" RRx generated in step 211.

In step 217, the 32 bit CRC of the augmented final interval generated in step 215 is computed. Any CRC generating method may be used to calculate the CRC of the augmented final interval. Finally, in step 219, the 32 bit CRC of the augmented final interval generated in step 219 is returned as the CRC value for the relevant data.

FIG. 8 illustrates the operations of step 211 whereby the permute instruction of the vector unit 210 is used to index into the table of precomputed CRC values (T0, T1, T2, T3) stored in the vector register file in order to parallelize the calculation of the CRC of the current interval. For the sake of description, the operations described below utilize vector registers that are 128 bits in length, however, the present invention is not limited in respect and can implemented with vector registers of arbitrary length.

The operation begins in step 301 by loading the vector registers of the vector unit 210 with the table of precomputed CRC values generated in step 109. For example, the vector registers may be loaded with vectors T0 . . . T3 as described above.

In step 303, a vector register V is loaded with the most significant 128 bits (leftmost 128 bits) of the 156 bit value RRx generated in step 209.

In step 305, the 156 bit value RRx generated in step 209 is left shifted by 128 bits. That is the least significant 28 bits (rightmost 28 bits) of the value RRx become the most significant 28 bits (leftmost 28 bits) of RRx and the least significant 128 bits (rightmost 128 bits) of RRx are set to 0.

In step 307, the 4-bit nibbles of 128 bit vector register V (nibbles 0,1,2 . . . 31) are split into two vector registers V0 and V1, with V0 holding the "even" nibbles (nibbles 0,2, 4 . . . 30) and V1 holding the "odd" nibbles (nibbles 1,3,5 . . . 31). In addition, the vector register V0 holding the even nibbles is shifted to the right by 4 bits. Thus, the vector registers V0 and V1 become suitable for use as operand VB of the "permute" instruction. More concisely, V0:=(V>>4) & (0F0F0F0F0F0F0F0F0F0F0F0F0F0F0F0F(hex))

V1:=V & (0F0F0F0F0F0F0F0F0F0F0F0F0F0F0F0F (hex))

(Where "&" is a bit by bit "logical and" operation; ">>4" means right shift by 4 bits).

In step 309, the permute instruction is utilized to lookup the partial CRC values for each of the "nibbles" in V0 and V1 for each vector T0 . . . T4. These partial CRC values, denoted $R_{xy}$ are preferably determined utilizing the permute instruction as follows:

permute R00,T0,V0
permute R01,T1,V0
permute R02,T2,V0
permute R03,T3,V0
permute R10,T0,V1
permute R11,T1,V1 permute R12,T2,V1
permute R13,T3,V1

Where each "registered" value $R_{xy}$ is a 128 bit result.

In step 311, the $R_{xy}$ 128 bit values are combined to form a 156 bit value partial CRC result denoted RRv. More specifically, each of the $R_{xy}$ registers are preferably "extended" to 156 bits by right padding each the values from step 305 with 28 0-valued bits. The operation ">>k" means right shift the value by k bits, prepending k 0-valued bits on the left, and "dropping" k bits from the right. "Xor" is a bit-by-bit "logical exclusive or" operation. More concisely, RRv:=(R00>>0) xor (R01>>8) xor (R02>>16) xor (R03>>24) xor (R10>>4) xor (R11>>12) xor (R12>>20) xor (R13>>28)

In step 313, the value RRv generated in step 311 is combined with RRx generated in step 305 by an xor operation to yield the new "partial 156 bit CRC result". More concisely, RRx:=(RRx) xor (RRv)

This completes the update of RRx as required in Step 211.

Note that the computations of Steps 302 through Step 313 may be carried out in parallel depending upon the resources of the vector unit. For example, some or all of the permute instructions of step 309 and some or all of the shift and logical "xor" operations of step 311 may be carried out in parallel. Moreover, the the computations of Steps 302 through Step 313 may be carried out with fewer registers (than we have named for expository purposes) by judicious interleaving (instruction re-ordering and register allocation) of the individual permute, shift, and logical "xor" and "and" instructions. Also, of course, 156 bit logical values may be stored in two (or more) actual machine registers.

In the operations above, each interval is broken down into a sequence of contiguous nibbles. However, one skilled in the art will realize that each interval may be broken down in a sequence of sets of contiguous data elements of arbitrary length. For the sake of description, each set may be referred to as a chunk. In the operations above, each 128 bit interval with bits denoted B0,B1 . . . B127 are broken down into 32 chunks C0,C1 . . . C31 where chunk C0 includes bits B0. . . B3, chunk C1 includes bits B4 . . . B7, . . . and chunk C31 includes bits B124 . . . B127.

Advantageously, the present invention calculates the CRC of data in a data stream utilizing a small table of precomputed CRC values that efficiently maps to the vector register file of a SIMD processing element. In addition, the present invention uses a parallel table lookup instruction (i.e., the permute instruction of the vector unit 210) to index into the table in order to parallelize the calculation of the CRC of data in a data stream.

The present invention may be utilized in a communication system wherein data is communicated between a source node and a target node over a communication link. In such a system, the source node calculates the CRC of data to be transferred over the link using a predetermined polynomial. The source node then transmits the data along with the CRC over the link target node. The target node receives the data, independently generates the CRC of the received data using the predetermined generating polynomial, and compares the independently generated CRC with the CRC received from the source node. If the two CRC values match, no error is assumed to have occurred during the transmission. If the two CRC values do not match, an error is assumed to have occurred during the transmission. In this case, the target node may utilize error correction techniques to correct errors that have occurred during transmission and/or request re-transmission of the data by the source node. The present invention as described above may be utilized by the source node and/or target node to calculate the CRC of data using the predetermined polynomial.

In addition, the present invention may be used in a data processing system wherein data is transferred via an I/O bus from a storage device to memory for access by devices of the data processing system. In such a storage system, the storage device calculates the CRC of data to be transferred over the I/O bus using a predetermined polynomial. The storage device then transmits the data along with the CRC over the I/O bus to memory. A processing unit independently generates the CRC of the received data using the predetermined generating polynomial, and compares the independently generated CRC with the CRC received from the storage device. If the two CRC values match, no error is assumed to have occurred during the transmission. If the two CRC values do not match, an error is assumed to have occurred during the transmission. In this case, the processing unit may utilize error correction techniques to correct errors that have occurred during transmission and/or request re-transmission of the data by the storage device. The present invention as described above may be used by storage device and/or processing unit to calculate the CRC of data using the predetermined polynomial.

Although the invention has been shown and described with respect to the particular embodiments thereof, it should be understood by those skilled in the art that the foregoing and various other changes, omissions, and additions in the form and detail thereof may be made without departing from the spirit and scope of the invention.

We claim:

1. A method for generating a CRC value representing data in a digital data stream, the method comprising the steps of:

identifying relevant data in said digital data stream;

identifying a plurality of successive intervals in the relevant data, wherein said plurality of successive intervals comprise a set of intervals followed by a final interval;

determining a partial CRC value representing said set of intervals, wherein the following substeps are performed for each given interval in said set of intervals:

partitioning said given interval into a plurality of chunks;

determining a CRC value for each of said chunks; and combining said CRC values for said chunks;

combining portions of said final interval with said partial CRC value to thereby generate an augmented final interval; and generating a CRC value for said augmented final interval that represents a CRC value for the relevant data of said digital data stream.

2. The method of claim 1, wherein the step of combining said CRC values for said chunks comprises the steps of:

performing a logical shift operation on a first subset of the CRC values for said chunks to thereby generate an extended CRC value; and performing a logical bit by bit XOR operation on the extended CRC value and a second subset of the CRC values for said chunks, wherein said first and second subsets each comprise at least one of said CRC values for said chunks, and wherein said first subset of CRC values is distinct from said second subset of CRC values.

3. The method of claim 2, wherein said first and second subsets of CRC values each comprise a plurality of CRC values for said chunks.

4. The method of claim 2, wherein said logical shift operation on said first subset of CRC values performs the following logical operations: a right shift operation by a predetermined number of k bits on said first subset of CRC values, perpending k 0-valued bits onto the left of said first subset of CRC values, and dropping k bits from the right of said first subset of CRC values.

5. The method of claim 1, further comprising the step of:
loading from persistent storage a table of precomputed CRC values for a range of chunks, and wherein the CRC value of at least two chunks is determined by performing a parallel table lookup on said table.

6. The method of claim 5, wherein the CRC value for the relevant data is generated by a source node, and is used by a target node to detect a transmission error in a data stream communicated between the source node and a target node of a communication system.

7. The method of claim 5, wherein the CRC value for the relevant data is generated by a target node, and is used by the target node to detect a transmission error in a data stream communicated between a source node and the target node of a communication system.

8. The method of claim 5, wherein the CRC value for the relevant data is generated by a storage device, and is used by a processing unit to detect a transmission error in a data stream communicated between the storage device and said processing unit of a data processing system.

9. The method of claim 5, wherein the CRC value for the relevant data is generated by a processing unit, and is used by the processing unit to detect a transmission error in a data stream communicated between a storage device and the processing unit in a data processing system.

10. The method of claim 5, wherein said table of CRC values is stored as data elements in at least one vector register V1, and wherein said chunks are stored as data elements in at least one vector register V2.

11. The method of claim 10, wherein portions of said data elements in said at least one vector register V1 are copied to a vector register VA, wherein portions of said data elements in said at least one vector register V2 are copied to a vector register VB, and wherein the parallel table lookup comprises at least one vector permute instruction that selects data elements from said source vector register VA based upon indices stored as data elements in said source vector register VB and writes the selected data elements into a target vector register VT.

12. The method of claim 10, wherein said table of CRC values is stored as data elements in a first plurality of vector registers, and wherein said chunks are stored as data elements in a second plurality of vector registers.

13. The method of claim 12, wherein portions of said data elements stored in said first plurality of vector registers are copied to a vector register VA, wherein portions of said data elements stored in said second plurality of vector registers are copied to a vector register VB, and wherein the parallel table lookup comprises at least one vector permute instruction that selects data elements from said source vector register VA based upon indices stored as data elements in said source vector register VB and writes the selected data elements into a target vector register.

14. The method of claim 12, wherein said indices of said source vector register VB of said vector permute instruction are byte aligned, and wherein, a shift operation is performed on said portions of said data elements stored in said second plurality of vector registers that are copied to the vector register VB.

15. The method of claim 1, wherein said chunks are 4 bits in length.

16. The method of claim 1, wherein each CRC value is a 32-bit CRC value.

17. The method of claim 1, wherein said step of determining the CRC value for each of said chunks comprises the step of accessing a table of precomputed CRC values using an indexing scheme that is dependent upon a size of the chunks and independent of a size of the CRC values.

18. A program storage device readable by a machine, tangibly embodying a sequence of instructions executable by the machine to perform method steps for generating a CRC value representing data in a digital data stream, the method steps comprising:
identifying relevant data in said digital data stream;
identifying a plurality of successive intervals in the relevant data, wherein said plurality of successive intervals comprise a set of intervals followed by a final interval;
determining a partial CRC value representing said set of intervals, wherein the following substeps are performed for each given interval in said set of intervals:
partitioning said given interval into a plurality of chunks;
determining a CRC value for each of said chunks; and
combining said CRC values for said chunks;
combining portions of said final interval with said partial CRC value to thereby generate an augmented final interval; and
generating a CRC value for said augmented final interval that represents a CRC value for the relevant data of said digital data stream.

19. The program storage device of claim 18, wherein the step of combining said CRC values for said chunks comprises the steps of:
performing a logical shift operation on a first subset of the CRC values for said chunks to thereby generate an extended CRC value; and
performing a logical bit by bit XOR operation on the extended CRC value and a second subset of the CRC values for said chunks, wherein said first and second subsets each comprise at least one of said CRC values for said chunks, and wherein said first subset of CRC values is distinct from said second subset of CRC values.

20. The program storage device of claim 19, wherein said first and second subsets of CRC values each comprise a plurality of CRC values for said chunks.

21. The program storage device of claim 19, wherein said logical shift operation on said first subset of CRC values performs the following logical operations: a right shift operation by a predetermined number of k bits on said first subset of CRC values, perpending k 0-valued bits onto the left of said first subset of CRC values, and dropping k bits from the right of said first subset of CRC values.

22. The program storage device of claim 18, further comprising the step of:
loading from persistent storage a table of precomputed CRC values for a range of chunks, and wherein the CRC value of at least two chunks is determined by performing a parallel table lookup on said table.

23. The program storage device of claim 22, wherein the CRC value of the relevant data is generated by a source node, and is used by a target node to detect a transmission error in a data stream communicated between the source node and a target node of a communication system.

24. The program storage device of claim 22, wherein the CRC value of the relevant data is generated by a target node, and is used by the target node to detect a transmission error in a data stream communicated between a source node and the target node of a communication system.

25. The program storage device of claim 22, wherein the CRC value of the relevant data is generated by a storage device, and is used by a processing unit to detect a transmission error in a data stream communicated between the storage device and said processing unit of a data processing system.

26. The program storage device of claim 22, wherein the CRC value of the relevant data is generated by a processing unit, and is used by the processing unit to detect a transmission error in a data stream communicated between a storage device and the processing unit in a data processing system.

27. The program storage device of claim 18, wherein said table of CRC values is stored as data elements in at least one vector register V1, and wherein said chunks are stored as data elements in at least one vector register V2.

28. The program storage device of claim 27, wherein portions of said data elements in said at least one vector register V1 are copied to a vector register VA, wherein portions of said data elements in said at least one vector register V2 are copied to a vector register VB, and wherein the parallel table lookup comprises at least one vector permute instruction that selects data elements from said source vector register VA based upon indices stored as data elements in said source vector register VB and writes the selected data elements into a target vector register VT.

29. The program storage device of claim 27, wherein said table of CRC values is stored as data elements in a first plurality of vector registers, and wherein said chunks are stored as data elements in a second plurality of vector registers.

30. The program storage device of claim 29, wherein portions of said data elements stored in said first plurality of vector registers are copied to a vector register VA, wherein portions of said data elements stored in said second plurality of vector registers are copied to a vector register VB, and wherein the parallel table lookup comprises at least one vector permute instruction that selects data elements from said source vector register VA based upon indices stored as data elements in said source vector register VB and writes the selected data elements into a target vector register.

31. The program storage device of claim 30, wherein said indices of said source vector register VB of said vector permute instruction are byte aligned, and wherein, a shift operation is performed on said portions of said data elements stored in said second plurality of vector registers that are copied to the vector register VB.

32. The program storage device of claim 18, wherein said chunks are 4 bits in length.

33. The program storage device of claim 18, wherein each CRC value is a 32-bit CRC value.

34. The method of claim 18, wherein said step of determining the CRC value for each of said chunks comprises the step of accessing a table of precomputed CRC values using an indexing scheme that is dependent upon a size of the chunks and independent of a size of the CRC values.

* * * * *